(12) United States Patent
Tanaka et al.

(10) Patent No.: US 7,078,150 B1
(45) Date of Patent: Jul. 18, 2006

(54) PHOTOSENSITIVE RESIN PRINT PLATE MATERIAL AND PRODUCTION METHOD FOR PHOTOSENSITIVE RESIN PRINT PLATE

(75) Inventors: Shinji Tanaka, Okazaki (JP); Katsuhiro Uehara, Tokyo (JP)

(73) Assignee: Toray Industries, Inc. (JP)

( * ) Notice: Subject to any disclaimer, the term of this patent is extended or adjusted under 35 U.S.C. 154(b) by 0 days.

(21) Appl. No.: 09/890,926

(22) PCT Filed: Nov. 28, 2000

(86) PCT No.: PCT/JP00/08356

§ 371 (c)(1),
(2), (4) Date: Aug. 7, 2001

(87) PCT Pub. No.: WO01/42857

PCT Pub. Date: Jun. 14, 2001

(30) Foreign Application Priority Data

Dec. 9, 1999 (JP) ................... 11/350793
Jan. 13, 2000 (JP) ............... 2000-005044

(51) Int. Cl.
*G03F 7/11* (2006.01)

(52) U.S. Cl. ................. 430/271.1; 430/273.1; 430/281.1

(58) Field of Classification Search .......... 430/5, 430/270.1, 271.1, 273.1, 281.1, 286.1, 302, 430/306, 332, 333, 394, 348, 944, 945, 964, 430/156, 162
See application file for complete search history.

(56) References Cited

U.S. PATENT DOCUMENTS

| 4,555,471 | A | * | 11/1985 | Barzynski et al. | 430/273.1 |
| 5,168,029 | A | * | 12/1992 | Igarashi et al. | 430/138 |
| 5,698,373 | A | * | 12/1997 | Fujikawa et al. | 430/288.1 |
| 5,759,742 | A | * | 6/1998 | West et al. | 430/278.1 |
| 5,858,604 | A | * | 1/1999 | Takeda et al. | 430/162 |
| 5,922,502 | A | * | 7/1999 | Damme et al. | 430/162 |
| 5,922,508 | A | * | 7/1999 | Zertani et al. | 430/273.1 |
| 5,948,596 | A | * | 9/1999 | Zhong et al. | 430/278.1 |
| 6,080,523 | A | * | 6/2000 | Vermeersch et al. | 430/270.1 |
| 6,140,005 | A | * | 10/2000 | Van Damme et al. | 430/156 |
| 6,387,595 | B1 | * | 5/2002 | Teng | 430/302 |
| 6,410,208 | B1 | * | 6/2002 | Teng | 430/302 |
| 6,413,700 | B1 | * | 7/2002 | Hallman et al. | 430/302 |
| 6,479,217 | B1 | * | 11/2002 | Grinevich et al. | 430/306 |
| 2001/0038975 | A1 | * | 11/2001 | Daems et al. | 430/322 |
| 2002/0197540 | A1 | * | 12/2002 | Goodin et al. | 430/5 |

FOREIGN PATENT DOCUMENTS

| JP | 01-133044 | * | 5/1989 |
| JP | 11-352670 A | * | 12/1999 |

* cited by examiner

*Primary Examiner*—Barbara L. Gilliam
(74) *Attorney, Agent, or Firm*—DLA Piper Rudnick Gray Cary US LLP

(57) ABSTRACT

Disclosed is a photosensitive resin printing plate material, which comprises at least a support, a photosensitive resin layer and a photocoloring layer, and in which the photocoloring layer is UV-transmissive before colored, and is colored through exposure to light having a wavelength of from 450 to 1500 nm to be substantially UV-non-transmissive. This is transparent and can reproduce any fine relief, not requiring an original picture film.

5 Claims, No Drawings

PHOTOSENSITIVE RESIN PRINT PLATE MATERIAL AND PRODUCTION METHOD FOR PHOTOSENSITIVE RESIN PRINT PLATE

TECHNICAL FIELD

The present invention relates to a photosensitive resin printing plate material capable of forming a photosensitive resin printing plate with relief thereon, and to a method for producing such a photosensitive resin printing plate from the material. The photosensitive resin printing plate thus produced is usable for relief printing and flexographic printing plates.

BACKGROUND ART

Use of photosensitive resin compositions for printing plate materials is known, and it is the main stream in the art of relief printing, lithographic printing, intaglio printing and flexographic printing.

With its photosensitive resin layer being contacted with a negative or positive original picture film, the printing plate material of the type is exposed to activated rays through the original picture film so as to form a solvent-soluble part and a solvent-insoluble part in its photosensitive resin layer, and then processed into a printing plate having a relief image thereon.

The printing plate material thus requires a negative or positive original picture film and requires development. Therefore, for forming one printing plate from it, the material requires many steps and much labor.

With the recent progress in computerization, proposed are methods of directly outputting the information having been processed by computer onto a printing plate material followed by processing the resulting material into a relief or flexographic printing plate not requiring a step of preparing an original picture film for it.

Concretely, proposed are method (1) which is a method of forming an image on a photosensitive resin layer or on a thin film layer provided on a photosensitive resin layer, with toner or liquid ink, not requiring an original picture film (Japanese Patent Publication No. 20029/1983, Japanese Patent Laid-Open Nos. 110164/1991, 10709/1998, 10710/1998); method (2) which is a method of directly obtaining a printing plate by exposing a porous material or a photosensitive layer to laser rays followed by dissolving or subliming the exposed part (Japanese Patent Laid-Open Nos. 56601/1977, 127005/1978, Japanese Patent Publication No. 40033/1981, Japanese Patent Laid-Open No. 106249/1986, International Patent Publication Nos. 505840/1995, 506780/1995, Japanese Patent Laid-Open Nos. 99478/1996, 90947/1996, 142050/1997, 254351/1997; and method (3) which is a method of forming a pattern on an IR-sensitive layer provided on the surface of a photosensitive resin layer, by exposing it to laser rays, not requiring an original picture film (Japanese Patent Laid-Open No. 52646/1983, Japanese Patent Nos. 2,773,847, 2,773,981, International Patent Publication No. 509254/1998, Japanese Patent Laid-Open Nos. 305007/1996, 305030/1996, 171247/1997, 166875/1997, 39512/1998, 73917/1998).

The method (1) requires toner or liquid ink for image formation; it is problematic in that fine images could not be formed therein. In the method (2), a porous material or a photosensitive layer is exposed to high-energy laser rays, and therefore this method is problematic in that sharp images are difficult to obtain therein since the relief edges of the porous material and the photosensitive layer melt down. In the method (3), the IR-sensitive layer formed is not transparent, and therefore it is problematic in that the photosensitive resin printing plate processed by method (3) is difficult to inspect. In this, even though the layer is transparent in some degree, it is still further problematic in that its UV-blocking ability is unsatisfactory.

In view of the above-mentioned problems, the present invention relates to a photosensitive resin printing plate material which is transparent and thereby able to accept virtual inspection and which can form an image thereon through exposure to light having a wavelength of from 450 to 1500 nm. Concretely, through the step of image formation thereon, the material enables a difference between the UV-transmissive portions and the UV-non-transmissive portions thereof to thereby reproduce even fine relief thereon, not requiring an original picture film.

DISCLOSURE OF THE INVENTION

Solving the above-mentioned problems, the essential constitution of the invention is as follows.

Specifically, the photosensitive resin printing plate material of the invention comprises at least a support, a photosensitive resin layer and a photocoloring layer, in which the photocoloring layer is UV-transmissive before colored, and is colored through exposure to light having a wavelength of from 450 to 1500 nm to be substantially UV-non-transmissive.

The essential constitution of the method for producing a photosensitive resin printing plate of the invention is as follows. Specifically, the method comprises at least the steps of forming an image in a photocoloring layer, exposing the photosensitive resin layer to light through the photocoloring layer, and developing the photosensitive resin layer.

BEST MODES OF CARRYING OUT THE INVENTION

The photosensitive resin printing plate material of the invention comprises a support, a photosensitive resin layer and a photocoloring layer.

The layers are described in detail hereinunder.

The support in the invention is made of a metal sheet such as steel, stainless, aluminum, etc., or a plastic sheet of polyester, etc., or a synthetic rubber sheet of styrene-butadiene rubber, etc. Its thickness is determined depending on its use, but may generally fall between 50 and 1000 μm.

Preferably, an adhesive layer is provided on the support for enhancing the adhesiveness between the support and the photosensitive resin layer. Though varying depending on the type of the support, generally used is a polyester adhesive or epoxy adhesive for the adhesive layer. Preferably, the thickness of the adhesive layer falls between 0.5 and 40 μM.

The photosensitive resin layer in the invention is photocurable through exposure to light. Preferably, it is photocurable through exposure to light having a wavelength of from 300 to 450 nm. The photosensitive resin layer is in the form of a sheet of a photosensitive resin composition, preferably having a thickness of from 0.1 to 10 mm.

Preferably, the photosensitive resin composition contains at least an ethylenic unsaturated monomer and a photopolymerization initiator.

The ethylenic unsaturated monomer is a substance crosslinkable through radical polymerization. It is not specifically limited, provided that it is crosslinkable through radical polymerization. In general, it includes the following:

Compounds having only one ethylenic unsaturated bond, for example, hydroxyl group-having (meth)acrylates such as 2-hydroxyethyl (meth)acrylate, 2-hydroxypropyl (meth) acrylate, 2-hydroxybutyl (meth)acrylate, 3-chloro-2-hydroxypropyl (meth)acrylate, β-hydroxy-β'-(meth)acryloyloxyethyl phthalate, etc., alkyl (meth)acrylates such as methyl (meth)acrylate, ethyl (meth)acrylate, propyl (meth) acrylate, butyl (meth)acrylate, isoamyl (meth)acrylate, 2-ethylhexyl (meth)acrylate, lauryl (meth)acrylate, stearyl (meth)acrylate, etc., cycloalkyl (meth)acrylates such as cyclohexyl (meth)acrylate, etc., halogenoalkyl (meth)acrylates such as chloroethyl (meth)acrylate, chloropropyl (meth)acrylate, etc., alkoxyalkyl (meth)acrylates such as methoxyethyl (meth)acrylate, ethoxyethyl (meth)acrylate, butoxyethyl (meth)acrylate, etc., phenoxyalkyl (meth)acrylates such as phenoxyethyl acrylate, nonylphenoxyethyl (meth)acrylate, etc., alkoxyalkylene glycol (meth)acrylates such as ethoxydiethylene glycol (meth)acrylate, methoxytriethylene glycol (meth) acrylate, methoxydipropylene glycol (meth) acrylate, etc., (meth) acrylamides such as (meth) acrylamide, diacetone(meth)acrylamide, N,N'-methylenebis (meth)acrylamide, etc., as well as 2,2-dimethylaminoethyl (meth)acrylate, 2,2-diethylaminoethyl (meth)acrylate, N,N-dimethylaminoethyl(meth)acrylamide, N,N-dimethylaminopropyl(meth)acrylamide, 2-hydroxyethyl (meth)acrylate, 3-chloro-2-hydroxypropyl (meth)acrylate, etc.; and compounds having two or more ethylenic unsaturated bonds, for example, polyethylene glycol di(meth)acrylates such as diethylene glycol di(meth)acrylate, etc., polypropylene glycol di(meth)acrylates such as dipropylene glycol di(meth) acrylate, etc., trimethylolpropane tri(meth)acrylate, pentaerythritol tri(meth)acrylate, pentaerythritol tetra(meth) acrylate, glycol tri(meth)acrylate, poly(meth)acrylates obtained through addition reaction of ethylene glycol diglycidyl ether with a compound having an ethylenic unsaturated bond and an active hydrogen of, for example, unsaturated carboxylic acids or unsaturated alcohols, poly(meth) acrylates obtained through addition reaction of an unsaturated epoxy comopund, e.g., glycidyl (meth)acrylate with a compound having an active hydrogen of, for example, carboxylic acids or amines, poly(meth)acrylamides such as methylenebis(meth)acrylamide, etc., polyvinyl compunds such as divinylbenzene, etc.

The photo-polymerization initiator is not specifically limited, provided that it has the ability to initiate the polymerization of photo-polymerizable carbon—carbon unsaturated groups. Above all, preferred for use herein are those capable of absorbing light to form a radical through autolysis or hydrogen pull reaction. For example, the initiators include benzoin alkyl ethers, benzophenones, anthraquinones, benzils, acetophenones, diacetyls, etc.

Preferably, the photosensitive resin composition for use in the invention contains a carrier resin in order that it can be solid and can keep the shape of its layer. In general, the type of the carrier resin to be used in the resin composition varies, depending on the type of the ink to be applied to the printing plates that comprise a layer of the resin composition. For the printing plates for aqueous ink, the carrier resin may be ordinary rubber or elastomer, including, for example, butadiene rubber, nitrile rubber, urethane rubber, isoprene rubber, styrene-butadiene rubber, styrene-isoprene rubber, etc. For those for oily ink, it may be hydrophilic resin, including, for example, partially-saponified vinyl acetate, polyamide resin, polyvinyl alcohol, as well as their modified derivatives such as maleic acid-modified derivatives, succinic acid-modified derivatives, epoxy-modified derivatives, e.g., glycidyl methacrylate-modified derivatives, etc.

In addition, the photosensitive resin composition may contain any other components. For example, it may contain, as a compatibilizer for enhancing the compatibility of the constituent ingredients and the flexibility of the resin layer, a polyalcohol such as ethylene glycol, diethylene glycol, triethylene glycol, glycerin, trimethylolpropane or trimethylolethane, or liquid rubber such as liquid polybutadiene or liquid polyisoprene, and may contain a known polymerization inhibitor for enhancing the heat stability of the resin layer. Preferred examples of the polymerization inhibitor are phenols, hydroquinones, and catechols. The photosensitive resin composition may further contain dye, pigment, surfactant, UV absorbent, fragrance, antioxidant, etc.

For forming a layer of the photosensitive resin composition that contains a carrier resin, herein employed is a method that comprises dissolving a carrier resin in a solvent for the resin, then adding thereto an ethylenic unsaturated monomer and a photo-polymerization initiator, fully stirring them to prepare a solution of a photosensitive resin composition, then removing the solvent from the solution, and finally extruding a melt of the resulting resin composition onto a support coated with an adhesive.

The photocoloring layer in the invention is UV-transmissive before colored, and is colored through exposure to light having a wavelength of from 450 to 1500 nm to become substantially UV-non-transmissive.

UV-transmission through the layer can be determined on the basis of the optical density of the layer. The optical density is generally designated by D, and is defined by the following equation.

$$D=log_{10}O=log_{10}(1/T)=log_{10}(I_0/I)$$

wherein $O=I_0/I$ indicates the photographic density of the layer, T indicates the transmittance thereof, $I_0$ indicates the intensity of the light applied to the layer for measurement of the transmittance, and I indicates the intensity of the transmitted light.

For determining the optical density, known are a method comprising measuring the intensity of the transmitted light and measuring the intensity of the incident light. In the invention, the optical density is determined on the basis of the intensity of the transmitted light.

Concretely, for example, the optical density can be measured with a Macbeth transmission densitometer TR-927 (from Kollmorgen Instruments Corporation), using an orthomatic filter.

In the invention, UV-transmission means that the optical density of the layer is at most 0.5, and substantial UV-non-transmission means that the optical density of the layer is at least 1.5.

The photocoloring layer includes two cases; (1) it contains at least a photothermal-transforming substance, a thermal color former and a developer all in one, or (2) it comprises at least a layer that contains a photothermal-transforming substance and a layer that contains a thermal color former and a developer.

The photothermal-transforming substance is a compound that absorbs light having a wavelength of from 450 to 1500 nm and generates heat. Concretely, it includes black pigments such as carbon black, titanium black, aniline black, cyanine black, etc.; green pigments such as phthalocyanine-type or naphthalocyanine-type pigments, etc.; carbon graphite, diamine-type metal complexes, dithiol-type metal complexes, phenolthiol-type metal complexes, mercaptophenol-type metal complexes, crystal water-containing inorganic compounds, copper sulfate, chromium sulfide, silicates, as well as metal oxides such as titanium oxide, vanadium oxide, manganese oxide, iron oxide, cobalt oxide, tungsten oxide, etc., and hydroxides and sulfates of such metals, etc.

Of those, preferred for the photothermal-transforming substance for use herein are colorants, especially dyes capable of absorbing IR or near-IR rays, in view of their light transmittance within a wavelength range of from 300 nm to 450 nm and of their transparency. Of the colorants of the type, more preferred are cyanine compounds, phthalocyanine compounds, naphthalocyanine compounds, dithiol metal complexes, biazulenium compounds, squarylium compounds, croconium compounds, azo-type disperse dyes, bisazo compounds, bisazostilbene compounds, naphthoquinone compounds, anthraquinone compounds, perylene compounds, polymethine compounds, indaniline metal complex dyes, intermolecular CT compounds, benzothiopyran compounds, spiropyran compounds, nigrosine compounds, thioindigo compounds, nitroso compounds, light absorbance.

Preferably, the photothermal-transforming substance content of the photocoloring layer composition falls between 1 and 40% by weight, more preferably between 2 and 25% by weight of the solid content of the composition. Containing at least 1% by weight of the substance, the layer effectively absorbs laser rays. Containing at most 40% by weight of the substance, the physical properties of the photocoloring layer composition is not influenced by the substance.

The thermal color former is a compound capable of forming a color when heated. For this, any known compound is usable 9 herein so far as it has the function of forming a color under heat. Preferred are leuco compounds, concretely including triphenylmethanephthalide-type, triallylmethane-type, phenothiazine-type, thiophenyloran-type, xanthene-type, indophthalyl-type, spirofuran-type, azaphthalide-type, chromenopyrazole-type, methine-type, rhodamine-anilinolactam-type, rhodamine-lactam-type, quinazoline-type, diazoxanthene-type and bislactone-type compounds.

The thermal color former content of the photocoloring layer is not specifically defined, as it varies depending on the optical density of the colored layer. Preferably, however, it falls between 0.1 and 30% by weight, more preferably between 0.5 and 20% by weight of the solid content of the photocoloring layer the optical density of the colored layer. Preferably, however, it falls between 0.1 and 30% by weight, more preferably between 0.5 and 20% by weight of the solid content of the photocoloring layer composition. Containing such a thermal color former in an amount of at least 0.1% by weight, the layer can have the necessary optical density after being processed for color formation therein. Containing it in an amount of at most 30% by weight, the mechanical strength of the layer does not decrease. The defined range of the thermal color former content is therefore preferred for these reasons.

The developer is not specifically defined, so far as it has the ability to assist the color formation from the thermal color former. For example, it includes phenolic compounds, thiophenolic compounds, thiourea derivatives, organic acids and their metal salts, dibasic acids, organic phosphate compounds, etc.

Preferably, the developer content of the photocoloring layer composition falls between 0.1 and 50% by weight of the solid content of the composition. The developer, if in the layer in an amount of at least 0.1% by weight, well exhibits its effect to assist the color formation from the thermal color former therein. Containing it in an amount of at most 50% by weight, the mechanical strength of the photocoloring layer does not decrease. The defined range of the developer content is therefore preferred for these reasons.

The photocoloring layer composition generally contains a carrier resin. The resin is not specifically defined, including, for example, the following: polyvinyl alcohol, polyvinyl acetate, partially-saponified polyvinyl acetate, cellulose resin, acrylic resin, polyvinylpyrrolidone, nylon resin, urethane resin, ethylene-vinyl acetate copolymer, polybutadiene, polyisoprene, styrene-butadiene rubber, nitrile rubber, etc. However, these are not limitative.

Preferably, the carrier resin content of the photocoloring layer composition falls between 20 and 99% by weight, more preferably between 30 and 60% by weight of the solid content of the composition. Containing such a carrier resin in an amount of at least 20% by weight, the photocoloring layer can keep its shape. The carrier resin in the layer in an amount of at most 99% by weight does not have any negative influence of the optical density of the layer.

If desired, the photocoloring layer may further contain an additional ingredient, plasticizer. The plasticizer includes, for example, glycols such as ethylene glycol, diethylene glycol, triethylene glycol, etc.; polyalkylene glycols such as polyethylene glycol, polypropylene glycol, etc.; liquid rubber such as liquid polybutadiene, liquid isoprene rubber.

The thickness of the photocoloring layer is not specifically defined, so far as the optical density of the colored layer is enough for use herein. Its preferred range falls between 0.1 μm and 30 μm. Having a thickness of at least 0.1 μm, the colored layer can well block UV transmission through it. In the layer not thicker than 30 μm, the UV absorption by the carrier resin is reduced. The defined range of the layer thickness is therefore preferred for these reasons.

If desired, a protective film may be provided on the uppermost layer of the printing plate material of the invention. For the protective film, usable is any film of polyethylene terephthalate, polybutylene terephthalate, polyethylene, polypropylene, etc. Preferably, the film has a thickness falling between 5 μm and 150 μm. The film not thinner than 5 μm well serve as a protective film. Not thicker than 150 μm, the protective film is flexible and is easy to peel. The defined range of the film thickness is therefore preferred for these reasons.

Also if desired, a release layer may be provided between the protective film and the photocoloring layer. The release layer makes it possible to peel only the protective film. Its material is not specifically defined, as long as it facilitates the release of the protective layer. For example, it includes polyvinyl alcohol, polyvinyl acetate, partially-saponified polyvinyl acetate, cellulose resin, acrylic resin, polyvinylpyrrolidone, nylon resin, urethane resin, ethylene-vinyl acetate copolymer, polybutadiene, polyisoprene, styrene-butadiene rubber, nitrile rubber, polyester resin. However, these are not limitative.

Still if desired, a substance transfer-preventing layer may be provided between the photosensitive resin layer and the photocoloring layer. This is for preventing the photothermal-transforming substance, the color former and the developer existing in the photocoloring layer and also the substances existing in the photosensitive resin layer from transferring. The material for the layer is not specifically defined, as long as it has the ability to prevent the substances from transferring into the other layers, especially into the photosensitive resin layer. Some examples of the material are mentioned below.

For the substance transfer-preventing layer, usable is a binder resin selected from water-soluble resins, hydrophobic resins and UV-curable resins. In case where the carrier resin in the photosensitive resin layer is a water-soluble resin such as partially-saponified polyvinyl acetate or water-soluble nylon resin, hydrophobic resins and UV-curable resins are preferred for the substance transfer-preventing layer as their effect is good. On the other hand, in case where the carrier resin in the photosensitive resin layer is a hydrophobic resin such as butadiene rubber or styrene-isoprene rubber, water-soluble resins and UV-curable resins are preferred for the substance transfer-preventing layer as their effect is good.

Concretely, the water-soluble resins include polyvinyl alcohol, partially-saponified polyvinyl acetate (having a degree of saponification of at least 90%), cellulose resin, acrylic resin, polyvinylpyrrolidone, nylon resin, and their modified derivatives. The hydrophobic resins include partially-saponified polyvinyl acetate (having a degree of saponification of smaller than 90%), nylon resin, polyvinyl acetate, urethane resin, ethylene-vinyl acetate copolymer, polybutadiene, polyisoprene, styrene-butadiene rubber, nitrile rubber, polyester resin, as well as polyethylene terephthalate, polypropylene, polyethylene, etc.

The UV-curable resins are meant to indicate a composition that comprises an ethylenic unsaturated compound or an ethylenic group-having oligomer along with a photopolymerization initiator and can be polymerized through exposure to UV rays into a resinous material. If desired, the UV-curable resin of the type may be combined with any of the above-mentioned water-soluble resins or hydrophobic resins. For example, the ethylenic unsaturated compound includes 2-hydroxyethyl (meth)acrylate, methyl (meth)acrylate, cyclohexyl (meth)acrylate, methoxyethyl (meth)acrylate, etc. The ethylenic group-having oligomer includes urethane acrylates, epoxy acrylates, acryl-modified liquid butadiene rubbers, etc. The photopolymerization initiator includes benzoin alkyl ethers, benzophenones, anthraquinones, etc.

The thickness of the substance transfer-preventing layer is not specifically defined, so far as the layer is effective for blocking substances. Preferably, however, it falls between 0.5 and 20 µm. Having a thickness of at least 0.5 µm, the layer well exhibits its effect to prevent substances from moving. Having a thickness of at most 20 µm, the layer is good since the relief image of the colored layer can be substantially equal to the relief image of the photosensitive resin layer formed through exposure to UV rays via the colored layer.

For producing the photosensitive resin printing plate material of the invention, for example, a solution of a photocoloring layer composition dissolved in a solvent is applied to the photosensitive resin layer formed on a support, using a bar coater, a slit die coater, a gravure coater, a comma coater, a reverse coater or the like, and then dried. In case where a protective film is provided on the photocoloring layer, it is first coated with a photocoloring layer composition, using a coater such as that mentioned above, and dried to form thereon a photocoloring layer having a predetermined thickness, and then the thus-coated protective film is hermetically fitted to the photosensitive layer formed on a support, using a roller. In that manner, the photosensitive resin printing plate material produced has a protective film formed on the photocoloring layer thereof.

In case where a substance transfer-preventing layer is provided in the printing plate material, for example, a binder resin to become the layer is dissolved in a solvent, and the resulting solution is applied onto the photosensitive resin layer, using a bar coater, a slit die coater, a gravure coater, a comma coater, a reverse coater or the like, and thereafter a photocoloring layer is formed on the thus-formed, substance transfer-preventing layer according to the method mentioned above. In case where both a protective layer and a substance transfer-preventing layer are provided on and in the printing plate material, for examle, a photocoloring layer composition is first formed on a protective film in the manner mentioned above, then a solution of a binder resin to be the substance transfer-preventing layer is applied onto the photocoloring layer also in the manner mentioned above and optionally exposed to UV rays to thereby form the intended, substance transfer-preventing layer on the photocoloring layer, and finally the thus-coated protective film is hermetically fitted to the photosensitive resin layer formed on a support, using a roller.

The thus-produced, photosensitive resin printing plate material is processed into a photosensitive resin printing plate, for example, in the manner mentioned below.

The method for producing such a photosensitive resin printing plate of the invention is described hereinunder.

The method comprises at least a step of forming an image in a photocoloring layer, a step of exposing a photosensitive resin layer to light through the image, and a step of developing the photosensitive resin layer.

More precisely, the method for producing a photosensitive resin printing plate is characterized in that a photosensitive resin printing plate material having a photosensitive resin layer and a photocoloring layer laminated on a support is imagewise exposed to light having a wavelength of from 450 to 1500 nm whereby only the exposed site of the photocoloring layer is colored to form an image in the layer, then this is further exposed to light having a wavelength of from 300 to 450 nm via the image-having, colored layer to thereby imagewise cure the photosensitive resin layer, and thereafter this is processed with a developer so as to remove the resin layer except the cured resin to thereby form a relief image on the support.

In the step of forming an image in the photocoloring layer, the layer is, if coated with a protective film, imagewise exposed to a light from a laser having a wavelength of from 450 to 1500 nm, through the protective film directly as it is or after the protective film has been peeled off, to thereby form an image in the thus-exposed, colored layer. In this step, the laser rays are absorbed by the photothermal-transforming substance in the photocoloring layer, and the part of the layer exposed to the laser rays is heated to have an elevated temperature. With that, the thermal color former in the layer forms a color, and, as a result, the thus-colored layer does not substantially transmit UV rays. Through the process, the thus-exposed photocoloring layer has a colored region and a non-colored region, therefore having therein an image patterned by the combination of the two regions. For the laser exposure, used is any ordinary laser source. For example, usable are various lasers having an oscillation wavelength range of from 450 nm to 1500 nm, such as Ar ion lasers, Kr ion lasers, He—Ne lasers, He—Cd lasers, ruby lasers, glass lasers, semiconductor lasers, YAG lasers, titanium sapphire lasers, color lasers, nitrogen lasers, metal vapor lasers, etc. Of those, preferred are semiconductor lasers as they are technically much improved these days and are therefore more small-sized and more economical than the others.

In the next step of exposing the photosensitive resin layer through the photocoloring layer, the photosensitive resin printing plate material having been exposed to layer rays in the previous step is further exposed to light generally having a wavelength of from 300 nm to 450 nm, entirely on its surface via the image-formed, colored layer. In this step, since the colored region of the photocoloring layer having been exposed to laser rays in the previous step does not substantially transmit UV rays, the light of from 300 to 450 nm applied to the printing plate material does not reach the photosensitive resin layer of the material. Since the light applied to the photosensitive resin printing plate material in this step will enter it even through the sides thereof, it is desirable that the sides of the printing plate material are protected with a cover not transmitting the light. For the source of light falling within a wavelength range of from 300 nm to 450 nm, generally employed are any of high-pressure mercury lamps, ultra-high-pressure mercury lamps, metal halide lamps, xenon lamps, carbon arc lamps, chemical lamps, etc. After thus exposed to the light, the part of the photosensitive resin layer forms a substance not dissolving in a developer.

In the step of developing the photosensitive resin layer, the layer having been exposed in the previous step is developed with a developer capable of dissolving and removing the non-exposed part of the layer, for which, for example, a brush washer or a spray washer is used, and is provided with the developer of the type. Through the process, the exposed region of the photosensitive layer remains on the processed plate, therefore forming a relieve image thereon.

If desired, the thus-processed printing plate is dried, post-exposed and degummed. Thus produced, the printing plate is fitted in a printer.

EXAMPLES

The invention is described in detail with reference to the following Examples.

The layer compositions used in Examples, and the methods for producing them are described below.

(1) Photocoloring layer compositions:

Photocoloring layer composition 1:

The following ingredients were mixed at room temperature to give a uniform solution.

| | |
|---|---|
| (a) Polyvinylpyrrolidone (ISP Japan's K-120) | 40 wt.pts. |
| (b) Polymethine dye (Nippon Kayaku's KAYASORB IR820(B)) | 5 wt.pts. |
| (c) 3-(N-isoamyl-N-ethylamine)-7,8-benzofluoran | 10 wt.pts. |
| (d) Octadecylphosphonic acid | 30 wt.pts. |
| (e) Toluene | 135 wt.pts. |
| (f) Methyl ethyl ketone | 385 wt.pts. |
| (g) Methanol | 100 wt.pts. |
| (h) Methyl cellosolve | 200 wt.pts. |

Photocoloring layer composition 2:

<Composition Containing Photothermal-Transforming Substance>

The following ingredients were mixed at room temperature to give a uniform solution.

| | |
|---|---|
| (a) Polyvinylpyrrolidone (ISP Japan's K-120) | 40 wt.pts. |
| (b) Polymethine dye (Nippon Kayaku's KAYASORB IR820(B)) | 5 wt.pts. |
| (c) Methyl ethyl ketone | 250 wt.pts. |
| (d) Methanol | 100 wt.pts. |
| (e) Methyl cellosolve | 200 wt.pts. |

<Composition Containing Thermal Color Former and Developer>

The following ingredients were mixed at room temperature to give a uniform solution.

| | |
|---|---|
| (a) 3-(N-isoamyl-N-ethylamine)-7,8-benzofluoran | 10 wt.pts. |
| (b) Octadecylphosphonic acid | 30 wt.pts. |
| (c) Vinyl chloride-vinyl acetate copolymer | 30 wt.pts. |
| (d) Toluene | 135 wt.pts. |
| (e) Methyl ethyl ketone | 135 wt.pts. |

(2) Photosensitive resin layer compositions:

Photosensitive resin layer composition 1:

60 parts by weight of a salt of α,ω-diaminopolyoxyethylene (this was prepared by adding acrylonitrile to both terminals of polyethylene glycol having a number-average molecular weight of 600, followed by reducing the resulting adduct with hydrogen) and adipic acid (1/1, by mol), 20 parts by weight of ε-caprolactam and 20 parts by weight of a salt of hexamethylenediamine and adipic acid (1/1, by mol) were polymerized in melt under ordinary condition to give a polyamide 1 having a relative viscosity (measured by dissolving 1 g of the polymer in 100 ml of chloral hydrate, at 25° C.) of 2.50.

Next, the following ingredients were mixed to give a photosensitive resin composition 1.

| | |
|---|---|
| (a) Polyamide 1 | 50 wt.pts. |
| (b) Ethylenic unsaturated compound, i.e. adduct of glycidyl methacrylate (1 mol) and acrylic acid (1 mol) | 30 wt.pts. |
| (c) Polyadduct of propylene glycol diglycidyl ether (1 mol) and acrylic acid (2 mols) | 15 wt.pts. |
| (d) Diethylene glycol | 5 wt.pts. |
| (e) Dimethylbenzyl ketal | 1 wt.pt. |
| (f) Hydroquinone monomethyl ether | 0.01 wt.pts. |
| (g) Water | 30 wt.pts. |
| (h) Ethanol | 70 wt.pts. |

Photosensitive resin layer composition 2:

Starting materials, i.e. 100 parts by weight of water, 0.2 parts by weight of sodium dodecylbenzenesulfonate, 3 parts by weight of polyoxyethylene nonylphenyl ether, 0.3 parts by weight of potassium persulfate, 0.2 parts by weight of t-dodecylmercaptan, 29 parts by weight of methyl methacrylate, 1 part by weight of methacrylic acid and 70 parts by weight of butadiene were reacted at 50° C. for 20 hours to give an aqueous dispersion latex rubber 1 having a number-average particle size of 140 nm, a glass transition point of −52° C. and a solid content of 50.5% by weight.

Starting materials, i.e. 65 parts by weight of water, 1.3 parts by weight of disproportionated potassium rosinate, 1.7 parts by weight of potassium oleate, 1.5 parts by weight of sodium alkylsulfonate, 0.05 parts by weight of t-dodecylmercaptan, 0.1 parts by weight of paramenthane hydroperoxide, 0.003 parts by weight of iron sulfate, 0.006 parts by weight of sodium ethylenediaminetetraacetate, 0.005 parts by weight of sodium formaldehyde sulfoxylate, 1.2 parts by weight of potassium sulfate and 100 parts by weight of butadiene were reacted in a mode of low-temperature polymerization at 5° C. The degree of polymerization was about 60%. Thus was obtained an aqueous dispersion latex rubber 2 having a number-average particle size of 350 nm and a solid content of 55% by weight.

Next, the following ingredients were mixed under heat, and water was removed from the resulting mixture to give a photosensitive resin composition 2.

| | |
|---|---|
| (a) Aqueous dispersion latex rubber 1 | 33.6 wt.pts. (17 wt.pts. in terms of the solid content) |
| (b) Aqueous dispersion latex rubber 2 | 14.5 wt.pts. (8 wt.pts. in terms of the solid content) |
| (c) Phenoxypolyethylene glycol acrylate | 16 wt.pts. |
| (d) Polycondensate of glycerin polyether-polyol, succinic anhydride and 2-hydroxyethyl acrylate | 14 wt.pts. |
| (e) Polybutadiene rubber (Nippon Zeon's Nipol 1220 L) | 20 wt.pts. |
| (f) Nitrile rubber (Nippon Zeon's Nipol 1042) | 20 wt.pts. |
| (g) Dimethylbenzyl ketal | 1 wt.pt. |
| (h) Dioctyl phthalate | 2 wt.pts. |
| (i) Hydroquinone monomethyl ether | 0.1 wt.pts. |

(3) Substance transfer-preventing layer composition:

Substance transfer-preventing layer composition:

| | |
|---|---|
| (a) Partially-saponified polyvinyl acetate (having a degree of saponification of 95% and a mean degree of polymerization of 1000) | 100 wt.pts. |
| (b) Difunctional vinyl monomer obtained through addition reaction of ethylene glycol diglycidyl ether and acrylic acid | 50 wt.pts. |
| (c) Benzoin ethyl ether | 4 wt.pts. |
| (d) Water | 90 wt.pts. |
| (e) Ethanol | 210 wt.pts. |

Example 1

The photocoloring layer composition 1 was applied onto a protective film of polyethylene terephthalate having a thickness of 12 μm, using a bar coater, and dried to form thereon a photocoloring layer having a thickness of 10 μm. Thus coated, the film was transparent and green. Its optical density was 0.4. The substance transfer-preventing layer composition 1 was applied thereonto, using a bar coater, then dried, and exposed to an ultra-high-pressure mercury lamp for 30 seconds. Thus photocured, the substance transfer-preventing layer formed had a thickness of 8 μm.

Next, the photosensitive resin layer composition 1 was cast onto a support film of polyethylene terephthalate (thickness: 250 μm) coated with a polyester adhesive, and dried at 60° C. for 3 hours to form a photosensitive resin layer having a dry thickness of 650 μm.

The support film thus coated with the photosensitive resin layer was combined with the coated protective film that had been prepared in the above, with the photosensitive resin layer of the former being in contact with the substance transfer-preventing layer of the latter, and pressed by the use of a roller to produce a photosensitive resin printing plate material.

The thus-produced, photosensitive resin printing plate material was set in FX400-AP (Toray Engineering's photomechanical processor), and imagewise exposed to semiconductor laser beams (wavelength 830 nm, beam diameter 20 μm, energy 800 mJ/cm$^2$) through the protective film to form an image in the photocoloring layer. The optical density of the photocolored part of the layer was 2.8. After one week, the optical density of the photocolored part was still 2.8.

Next, using an exposing unit equipped with 10 chemical UV lamps (Mitsubishi Electric's FL20SBL-360), this was exposed to UV rays for 2 minutes through the photocolored layer. The distance between the printing plate material to be exposed and the light source was 60 mm. The edges of the printing plate material were covered with a light-shielding film to protect them from being exposed.

After exposed, the protective film was peeled off, and the printing plate material was developed with water at 25° C. for 1 minute, using a brush-type developing unit, to thereby wash away the non-crosslinked part of the photosensitive resin layer. Thus was obtained a photosensitive resin printing plate having a relief image formed thereon. This is usable for relief printing.

Example 2

In the same manner as in Example 1, a photosensitive resin printing plate material was produced in which, however, the substance transfer-preventing layer was not provided.

Also in the same manner as in Example 1, this photosensitive resin printing plate material was processed to form a photocolored image in the photocoloring layer. The image area had an optical density of 2.5. After 1 week, its optical density lowered to 1.6. This will be because the substances in the photosensitive resin layer in this printing plate material would have moved while the printing plate material was stored.

Also in the same manner as in Example 1, the photosensitive resin layer of this printing plate material was exposed to UV rays via the photocolored layer, then the protective film was removed, and the thus-exposed resin layer was developed by brushing in water. A photosensitive resin printing plate having a relief image formed thereon was thus obtained.

Example 3

In the same manner as in Example 1, a photocoloring layer was formed on a protective film.

Next, the photosensitive resin layer composition 2 (its amount is to form a photosensitive layer having a thickness of 1.7 mm) was put between a support film of polyethylene terephthalate (having a thickness of 125 μm and coated with a polyester adhesive) and the protective film coated with the photocoloring layer, and these were pressed by the use of a presser heated at 80° C. In the photosensitive resin printing plate material thus produced, the photocoloring layer and the photosensitive resin layer are in contact with each other.

Also in the same manner as in Example 1, the thus-produced, photosensitive resin printing plate material was exposed to form an image in the photocoloring layer.

Next, using the same exposing unit as in Example 1 equipped with 10 chemical UV lamps, this was exposed to UV rays for 2 minutes first through the support, and then for 5 minutes through the thermocolored layer. Its edges were covered with a light-shielding film to protect them from being exposed.

After exposed, the protective film was peeled off, and the printing plate material was developed with water at 40° C. for 7 minutes, using a brush-type developing unit, to thereby wash away the non-crosslinked part of the photosensitive resin layer. Thus was obtained a photosensitive resin print-

Example 4

The composition containing a thermal color former and a developer of the photocoloring layer composition 2 was applied onto a protective film of polyethylene terephthalate having a thickness of 12 μm, using a bar coater, and then dried to form a layer having a thickness of 12 μm. Next, the composition containing a photothermal-transforming substance of the composition 2 was applied thereonto, also using a bar coater, and then dried to form thereon another layer having a thickness of 8 μm. Thus coated, the film had an optical density of 0.5. This was further coated with the substance transfer-preventing layer composition, using a bar coater, then dried, and exposed to an ultra-high-pressure mercury lamp for 30 seconds. Thus photocured, the substance transfer-preventing layer formed had a thickness of 14 μm.

Next, the photosensitive resin layer composition 1 was cast onto a steel sheet support (thickness 100 μm) coated with an epoxy adhesive, and dried at 60° C. for 3 hours to form thereon a photosensitive resin layer having a dry thickness of 650 μm.

The steel sheet support thus coated with the photosensitive resin layer was combined with the coated protective film that had been prepared in the above, with the photosensitive resin layer of the former being in contact with the substance transfer-preventing layer of the latter, and pressed by the use of a roller to produce a photosensitive resin printing plate material.

The thus-produced, photosensitive resin printing plate material was set in FX400-AP (Toray Engineering's photomechanical processor), and imagewise exposed to semiconductor laser beams (wavelength 830 nm, beam diameter 20 μm, energy 800 mJ/cm$^2$) through the protective film to form an image in the photocoloring layer. The optical density of the photocolored part of the layer was 2.9. After one week, the optical density of the photocolored part was still 2.9.

Next, using an exposing unit equipped with 10 chemical UV lamps (Mitsubishi Electric's FL20SBL-360), this was exposed to UV rays for 2 minutes through the photocolored layer. The distance between the printing plate material to be exposed and the light source was 60 mm. The edges of the printing plate material were covered with a light-shielding film to protect them from being exposed.

After exposed, the protective film was peeled off, and the printing plate material was developed with water at 25° C. for 1 minute, using a brush-type developing unit, to thereby wash away the non-crosslinked part of the photosensitive resin layer. Thus was obtained a photosensitive resin printing plate having a relief image formed thereon. This is usable for relief printing.

Example 5

The composition containing a thermal color former and a developer of the photocoloring layer composition 2 was applied onto a protective film of polyethylene terephthalate having a thickness of 12 μm, using a bar coater, and then dried to form a layer having a thickness of 8 μm. Next, the composition containing a photothermal-transforming substance of the composition 2 was applied thereonto, also using a bar coater, and then dried to form thereon another layer having a thickness of 2 μm. Thus coated, the film had an optical density of 0.4.

Next, the photosensitive resin layer composition 1 was cast onto a support film of polyethylene terephthalate (thickness 250 μm) coated with a polyester adhesive, and dried at 60° C. for 3 hours to form thereon a photosensitive resin layer having a dry thickness of 650 μm.

The support film thus coated with the photosensitive resin layer was combined with the coated protective film that had been prepared in the above, with the photosensitive resin layer of the former being in contact with the photocoloring layer of the latter, and pressed by the use of a roller to produce a photosensitive resin printing plate material.

The thus-produced, photosensitive resin printing plate material was set in FX400-AP (Toray Engineering's photomechanical processor), and imagewise exposed to semiconductor laser beams (wavelength 830 nm, beam diameter 20 μm, energy 800 mJ/cm$^2$) through the protective film to form an image in the thermocoloring layer. The optical density of the thermocolored part of the layer was 2.6. After one week, the optical density of the photocolored part was 1.7.

Next, using an exposing unit equipped with 10 chemical UV lamps (Mitsubishi Electric's FL20SBL-360), this was exposed to UV rays for 2 minutes through the thermocolored layer. The distance between the printing plate material to be exposed and the light source was 60 mm. The edges of the printing plate material were covered with a light-shielding film to protect them from being exposed.

After exposed, the protective film was peeled off, and the printing plate material was developed with water at 25° C. for 1 minute, using a brush-type developing unit, to thereby wash away the non-crosslinked part of the photosensitive resin layer. Thus was obtained a photosensitive resin printing plate having a relief image formed thereon. This is usable for relief printing.

Example 6

In the same manner as in Example 5, a photocoloring layer was formed on a protective film.

Next, the photosensitive resin layer composition 2 (its amount is to form a photosensitive layer having a thickness of 1.7 mm) was put between a support film of polyethylene terephthalate (having a thickness of 125 μm and coated with a polyester adhesive) and the protective film coated with the thermocoloring layer and with the photothermal-transforming substance layer thereon, and these were pressed by the use of a presser heated at 80° C. to complete a photosensitive resin printing plate material.

The thus-produced, photosensitive resin printing plate material was exposed to form an image in the thermocoloring layer, in the same manner as in Example 1.

Next, using the same exposing unit as in Example 5 equipped with 10 chemical UV lamps, this was exposed to UV rays for 2 minutes first through the support, and then for 5 minutes through the thermocolored layer. Its edges were covered with a light-shielding film to protect them from being exposed.

After exposed, the protective film was peeled off, and the printing plate material was developed with water at 40° C. for 7 minutes, using a brush-type developing unit, to thereby wash away the non-crosslinked part of the photosensitive resin layer. Thus was obtained a photosensitive resin printing plate having a relief image formed thereon. This is usable for flexographic printing.

Example 7

The composition containing a photothermal-transforming substance of the photocoloring layer composition 2 was applied onto a protective film of polyethylene terephthalate having a thickness of 12 µm, using a bar coater, and then dried to form a layer having a thickness of 2 µm. Next, the composition containing a thermal color former and a developer of the composition 2 was applied thereonto, also using a bar coater, and then dried to form-thereon another layer having a thickness of 8 µm. The protective film was thus coated with a photocoloring layer of the two layers formed thereon. Thus coated, this had an optical density of 0.4.

Next, the photosensitive resin layer composition 1 was cast onto a support film of polyethylene terephthalate (thickness 250 µm) coated with a polyester adhesive, and dried at 60° C. for 3 hours to form thereon a photosensitive resin layer having a dry thickness of 650 µm.

The support film thus coated with the photosensitive resin layer was combined with the coated protective film that had been prepared in the above, with the photosensitive resin layer of the former being in contact with the photocoloring layer of the latter, and pressed by the use of a roller to produce a photosensitive resin printing plate material.

The thus-produced, photosensitive resin printing plate material was set in FX400-AP (Toray Engineering's photomechanical processor), and imagewise exposed to semiconductor laser beams (wavelength 830 nm, beam diameter 20 m, energy 800 mJ/cm$^2$) through the protective film to form an image in the thermocoloring layer. The optical density of the thermocolored part of the layer was 2.6.

Next, using the same exposing unit as in Example 1 equipped with 10 chemical UV lamps, this was exposed to UV rays for 2 minutes through the thermocolored layer. The distance between the printing plate material to be exposed and the light source was 60 mm. The edges of the printing plate material were covered with a light-shielding film to protect them from being exposed.

After exposed, the protective film was peeled off, and the printing plate material was developed with water at 25° C. for 1 minute, using a brush-type developing unit, to thereby wash away the non-crosslinked part of the photosensitive resin layer. Thus was obtained a photosensitive resin printing plate having a relief image formed thereon. This is usable for relief printing.

Comparative Example 1

A photosensitive resin printing plate material was produced in the same manner as in Example 5. In this, however, the photocoloring layer did not have a photothermal-transforming substance layer.

The photosensitive resin printing plate material was set in FX400-AP (Toray Engineering's photomechanical processor), and imagewise exposed to semiconductor laser beams (wavelength 830 nm, beam diameter 20 µm, energy 800 mJ/cm$^2$) through the protective film. In this, however, an image was not formed in the thermocoloring layer.

Probably, in this, the thermal color former was not heated to form a color, since a photothermal-transforming substance layer was not therein.

The invention claimed is:

1. A photosensitive resin printing plate material, which comprises a support, a photosensitive resin layer containing at least one of a polymer selected from the group consisting of partially-saponified polyvinyl acetate, polyamide resin, polyvinyl alcohol, and their modified derivatives, along with an ethylenic unsaturated compound and a photopolymerization initiator and a photocoloring single layer containing 1–40% by weight of a photothermal-transforming substance, 0.1–30% by weight of a thermal color former and 0.1–50% by weight of a developer, based on the solid content of the photocolor single layer, and in which the photocoloring single layer is UV-transmissive before being colored, and is colored through exposure to light having a wavelength of from 450 to 1500 nm to be substantially UV-non-transmissive.

2. The photosensitive resin printing plate material as claimed in claim 1, wherein the photothermal-transforming substance is at least one dye selected from the group consisting of cyanine dyes, polymethine dyes and naphthalocyanine dyes.

3. A photosensitive resin printing plate material, which comprises a support, a photosensitive resin layer containing at least one of a polymer selected from the group consisting of partially-saponified polyvinyl acetate, polyamide resin, polyvinyl alcohol, and their modified derivatives, along with an ethylenic unsaturated compound and a photopolymerization initiator, and a photocoloring double layer comprising a layer that contains 1–40% by weight of a photothermal-transforming substance and a layer that contains 0.1–30% by weight of a thermal color former and 0.1–50% by weight of a developer, based on the solid content of the photocolor double layer, and in which the photocoloring double layer is UV-transmissive before being colored, and is colored through exposure to light having a wavelength of from 450 to 1500 nm to be substantially UV-non-transmissive.

4. The photosensitive resin printing plate material as claimed in claim 3, wherein the layer that contains a thermal color former and a developer is UV-transmissive before being heated, and is colored, after being heated, to be substantially UV-non-transmissive.

5. A photosensitive resin printing plate material, which comprises a support, a photosensitive resin layer, a photocoloring layer, and a substance transfer-preventing layer between the photosensitive resin layer and the photocoloring layer, wherein the photosensitive resin layer comprises a hydrophobic resin and the substance transfer-preventing layer comprises a water-soluble resin or UV-curable resin, and in which the photocoloring layer is UV-transmissive before being colored and is colored through exposure to light having a wavelength of from 450 to 1500 nm to be substantially UV-non-transmissive, wherein the photosensitive resin layer is photocured when exposed to light having a wavelength of from 300 to 450 nm, and its thickness falls between 0.1 mm and 10 mm.

* * * * *